(12) United States Patent
Chung

(10) Patent No.: US 10,528,086 B2
(45) Date of Patent: Jan. 7, 2020

(54) WEARABLE DEVICE AND ELECTRONIC DEVICE

(71) Applicant: SAMSUNG ELECTRONICS CO., LTD., Suwon-si (KR)

(72) Inventor: Seokwhan Chung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/943,094

(22) Filed: Apr. 2, 2018

(65) Prior Publication Data

US 2019/0041917 A1 Feb. 7, 2019

(30) Foreign Application Priority Data

Aug. 4, 2017 (KR) .................. 10-2017-0099078

(51) Int. Cl.
| | | |
|---|---|---|
| H05K 5/00 | (2006.01) | |
| H05K 7/00 | (2006.01) | |
| G06F 1/16 | (2006.01) | |
| H05K 1/02 | (2006.01) | |
| H05K 1/14 | (2006.01) | |
| G06F 3/044 | (2006.01) | |

(52) U.S. Cl.
CPC ............ *G06F 1/1658* (2013.01); *G06F 1/163* (2013.01); *G06F 1/1637* (2013.01); *H05K 1/028* (2013.01); *H05K 1/147* (2013.01); *G06F 3/044* (2013.01); *H05K 2201/056* (2013.01)

(58) Field of Classification Search
CPC ....................................................... G06F 1/16
See application file for complete search history.

(56) References Cited

U.S. PATENT DOCUMENTS

| | | | |
|---|---|---|---|
| 2002/0079653 A1 | 6/2002 | Noguchi et al. | |
| 2011/0235364 A1* | 9/2011 | Lo .................... | G02F 1/133308 362/611 |
| 2015/0044076 A1* | 2/2015 | Huang ................ | F04D 25/082 417/354 |
| 2015/0370224 A1* | 12/2015 | Emmert ................ | A44C 5/14 224/164 |
| 2016/0212526 A1 | 7/2016 | Salvatti et al. | |
| 2016/0254587 A1 | 9/2016 | Jung et al. | |
| 2016/0261032 A1* | 9/2016 | Chang .................. | H01Q 1/273 |

FOREIGN PATENT DOCUMENTS

| | | | |
|---|---|---|---|
| EP | 2367292 A2 | 9/2011 | |
| JP | 9127259 A | 5/1997 | |
| JP | 10-104374 A | 4/1998 | |
| JP | 2005-032752 A | 2/2005 | |
| JP | 4632774 B2 | 2/2011 | |
| JP | 2013003847 A | 1/2013 | |
| KR | 101167682 B1 | 7/2012 | |
| WO | WO-2009098844 A1 * | 8/2009 | .......... H04M 1/0277 |

OTHER PUBLICATIONS

Communication dated Dec. 14, 2018, from the European Patent Office in counterpart European Application No. 18177322.7.

* cited by examiner

*Primary Examiner* — Jerry Wu

(74) *Attorney, Agent, or Firm* — Sughrue Mion, PLLC

(57) ABSTRACT

A wearable device and an electronic device are provided. The wearable device includes a flexible circuit configured to electrically connect a touch sensor to a main board, a first waterproof member contacting a first surface of the flexible circuit and being elastically deformable, and a second waterproof member contacting a second surface of the flexible circuit and being elastically deformable.

13 Claims, 13 Drawing Sheets

WEARABLE DEVICE AND ELECTRONIC DEVICE

CROSS-REFERENCE TO RELATED APPLICATION

This application claims priority from Korean Patent Application No. 10-2017-0099078, filed on Aug. 4, 2017, in the Korean Intellectual Property Office, the disclosure of which is incorporated herein by reference in its entirety.

BACKGROUND

1. Field

Apparatuses consistent with example embodiments relate to a wearable device and an electronic device having a waterproof function.

2. Description of the Related Art

Recently, with the development of digital technology, various types of electronic devices, such as a mobile communication terminal, a smart phone, a tablet personal computer (PC), a personal digital assistant (PDA), an electronic notebook, a laptop computer, and a wearable device, are widely used. Such electronic devices have reached a mobile convergence step by having functions performed by other devices. For example, an electronic device of this type may have a call function, such as a voice call function and/or a video call function, a message exchanging function, such as a short message service (SMS) function, a multimedia message service (MMS) function, and/or an email function, an electronic notebook function, a photographing function, a broadcast reproducing function, a video reproducing function, a music reproducing function, an Internet function, a messenger function, a game function, and/or a social network service (SNS) function.

The electronic device may be designed in various forms. One of the forms is a wearable device that may be worn on a body part of a user.

SUMMARY

A wearable device and an electronic device having an improved waterproof function are provided.

According to an aspect of an example embodiment, there is provided a wearable device including a display, a glass member disposed on a first surface of the display, a touch sensor disposed on the glass member, a main board disposed on a second surface of the display, and a flexible circuit configured to transmit an electric signal between the touch sensor and the main board. The wearable device further includes a first waterproof member surrounding a first edge of the glass member, the first waterproof member being elastically deformable, and the first waterproof member contacting a third surface of the flexible circuit, a second waterproof member surrounding a second edge of the first waterproof member, the second waterproof member being elastically deformable, and the second waterproof member contacting a fourth surface of the flexible circuit, a case including an insertion hole into which the touch sensor is inserted, the case surrounding a third edge of the second waterproof member, and the case accommodating the main board, the display, and the glass member that are disposed in the case, and a strap connected to the case and configured to be wearable by a user.

The glass member may include a base portion having a first size larger than a second size of the insertion hole, and an intensity reinforcing portion having a third size smaller than the first size of the base portion and protruding forward from the base portion.

The first waterproof member may surround a fourth edge of the intensity reinforcing portion, and the flexible circuit may include a first portion disposed between the first waterproof member and the second waterproof member, and a second portion disposed between a front surface of the base portion and a rear surface of the second waterproof member and extending from the first portion.

An outer surface of the first waterproof member and an inner surface of the second waterproof member may have corresponding shapes.

One of the outer surface of the first waterproof member and the inner surface of the second waterproof member may have a concave shape, and another one of the outer surface of the first waterproof member and the inner surface of the second waterproof member may have a convex shape.

An outer surface of the first waterproof member or an inner surface of the second waterproof member may include a groove corresponding to a width and a thickness of the flexible circuit.

The wearable device may further include a waterproof adhesive disposed in a space defined by the flexible circuit, the first waterproof member, and the second waterproof member.

A thickness of the glass member may be from about 1 mm to about 5 mm.

The case may include a front case including the insertion hole and surrounding the third edge of the second waterproof member, and a rear case disposed at a rear of the front case.

The first waterproof member and the second waterproof member may be pressurized by the front case and the glass member.

According to an aspect of another example embodiment, there is provided an electronic device including a display, a glass member disposed on a first surface of the display, a touch sensor disposed on the glass member, a main board disposed on a second surface of the display, and a flexible circuit configured to transmit an electric signal between the touch sensor and the main board. The electronic device further includes a first waterproof member surrounding a first edge of the glass member, the first waterproof member being elastically deformable, and the first waterproof member contacting a third surface of the flexible circuit, a second waterproof member surrounding a second edge of the first waterproof member, the second waterproof member being elastically deformable, and the second waterproof member contacting a fourth surface of the flexible circuit, and a case including an insertion hole into which the touch sensor is inserted, the case surrounding a third edge of the second waterproof member, and the case accommodating the main board, the display, and the glass member that are disposed in the case.

The electronic device may further include a waterproof adhesive disposed in a space defined by the flexible circuit, the first waterproof member, and the second waterproof member.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
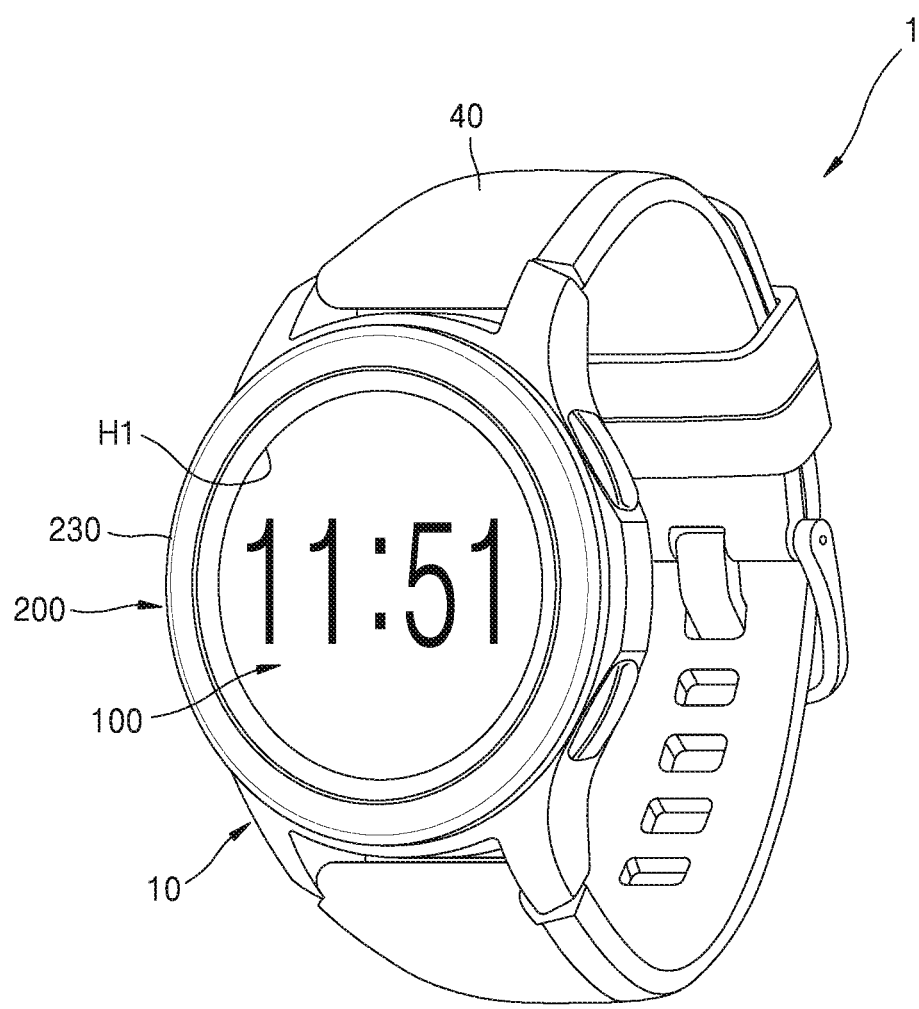
FIG. 1 is an assembled perspective view of a wearable device according to an example embodiment.

Reference will now be made in detail to example embodiments, examples of which are illustrated in the accompanying drawings, in which like reference numerals refer to like elements throughout and a size or thickness of each element may be exaggerated for clarity. In this regard, the example embodiments may have different forms and may not be construed as being limited to the descriptions set forth herein. Accordingly, the example embodiments are described below, by referring to the figures, to explain aspects. Expressions such as "at least one of," when preceding a list of elements, modify the entire list of elements and do not modify the individual elements of the list.

An electronic device according to example embodiments may include, for example, any one or any combination of a smart phone, a tablet personal computer (PC), a mobile phone, a video telephone, an e-book reader, a desktop PC, a laptop PC, a netbook computer, a workstation, a server, a personal digital assistant (PDA), a portable multimedia player (PMP), an MP3 player, a mobile medical device, a camera, and a wearable device. According to example embodiments, the wearable device may include any one or any combination of an accessory type (for example, a watch, a ring, a bracelet, an anklet, a necklace, glasses, a contact lens, or a head-mounted device (HMD), a fabric or clothing-integrated type (for example, electronic clothes), a body-attached type (for example, a skin pad or a tattoo), and a bioimplant type (for example, an implantable circuit).

Figure 2:
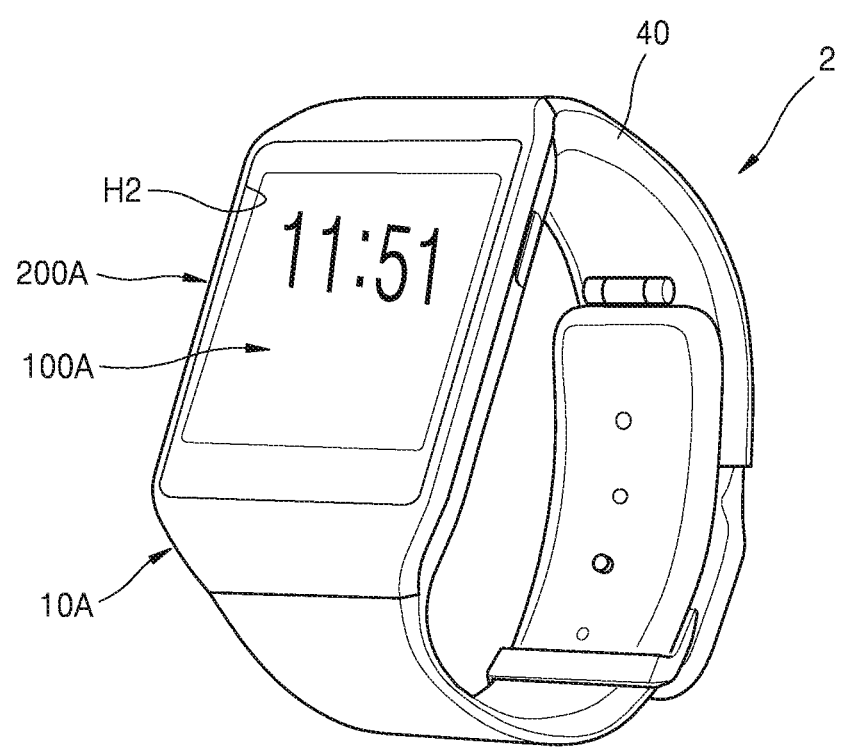
FIG. 2 is an assembled perspective view of a wearable device according to another example embodiment.

FIG. 1 is an assembled perspective view of a wearable device 1 according to an example embodiment, and FIG. 2 is an assembled perspective view of a wearable device 2 according to another example embodiment.

Referring to FIG. 1, the wearable device 1 may include a body 10 and a strap 40.

The body 10 includes a display device 100 and a case 200. The body 10 further includes a battery 330 (see FIG. 3), a main board 320 (see FIG. 3), and a bracket 310 (see FIG. 3). In addition, the body 10 may selectively include any one or any combination of various functional modules, such as a communication interface, a microphone, and a global positioning system (GPS).

The display device 100 may perform a function displaying an image or a video, and a function of detecting a touch of a user.

The case 200 surrounds an edge of the display device 100, and has an insertion hole H1 externally exposing a part of the display device 100. A shape of the insertion hole H1 may be a circle.

The case 200 forms an outer appearance of the wearable device 1. A bezel 230 may be provided in front of the case 200. The bezel 230 may rotate with respect to the case 200. The term "front" may signify a direction in which an image or a video is displayed on the display device 100.

The strap 40 is connected to the case 200 of the body 10. The strap 40 may allow the user to wear the wearable device 10 on a desired body part.

When two straps 40 are used, each of the strap 40 may be connected to the case 200 of the body 10. When the strap 40 is integrally formed with the body 10, the strap 40 may be wrapped around the body 10.

In FIG. 1, the body 10 of the wearable device 10 has a circular shape, but the body 10 is not limited thereto and may have other shapes. For example, as shown in FIG. 2, a body 10A of the wearable device 2 may have a rectangular shape. In this case, a display device 100A and a case 200A may also have rectangular shape. Also, an insertion hole H2 may have a rectangular shape.

Figure 3:
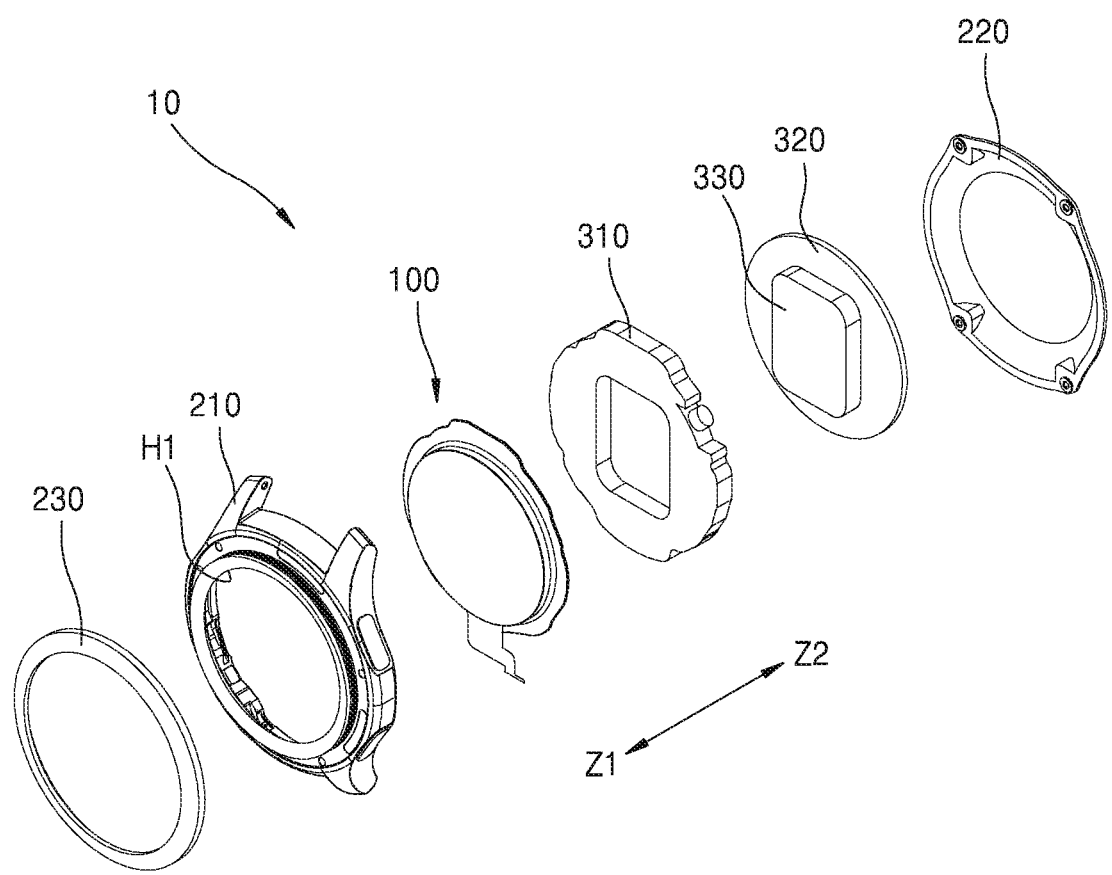
FIG. 3 is an exploded perspective view of a body of the wearable device of FIG. 1.
Figure 4A:
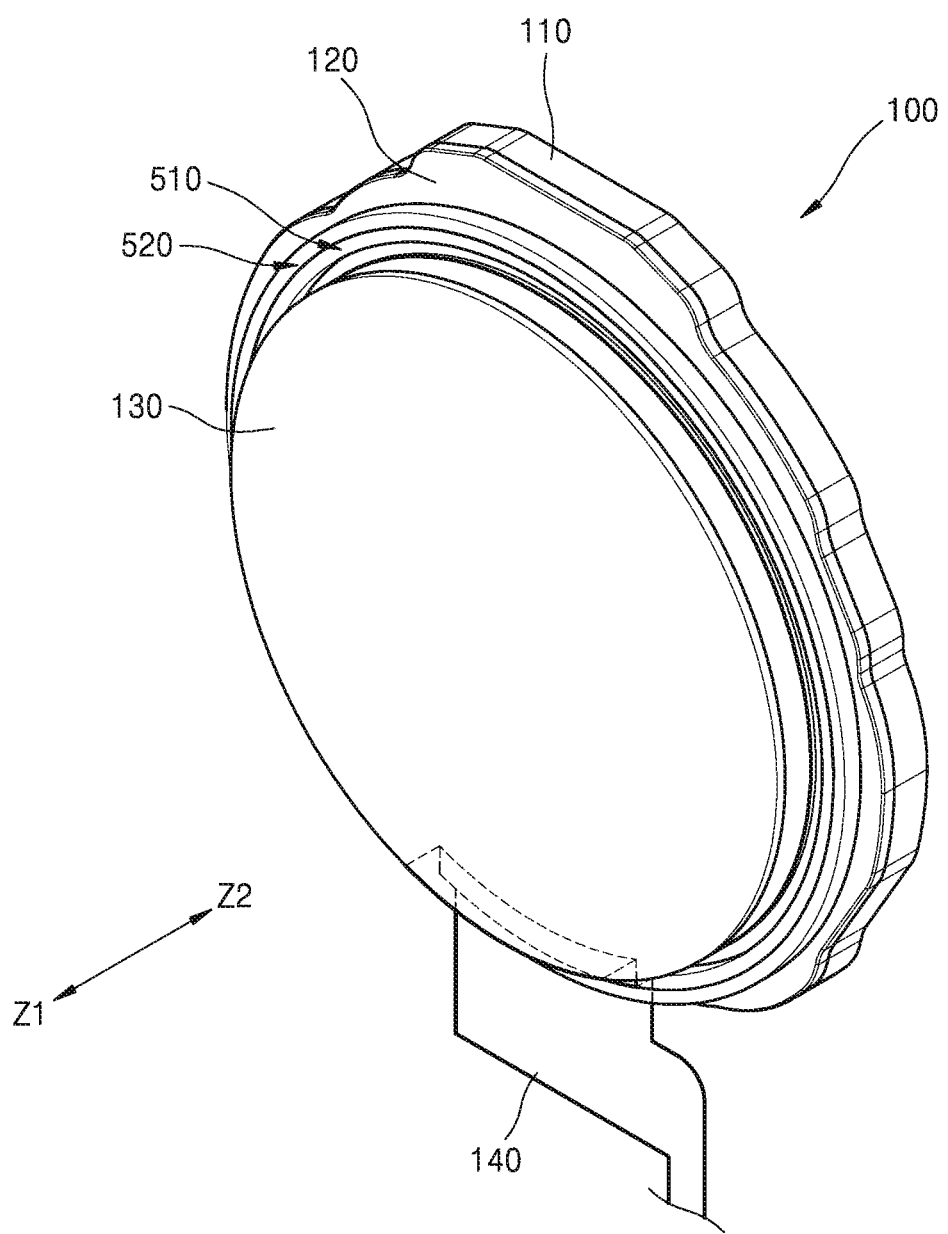
FIGS. 4A and 4B are respectively an assembled perspective view and an exploded perspective view of a display device of FIG. 3.
Figure 4B:
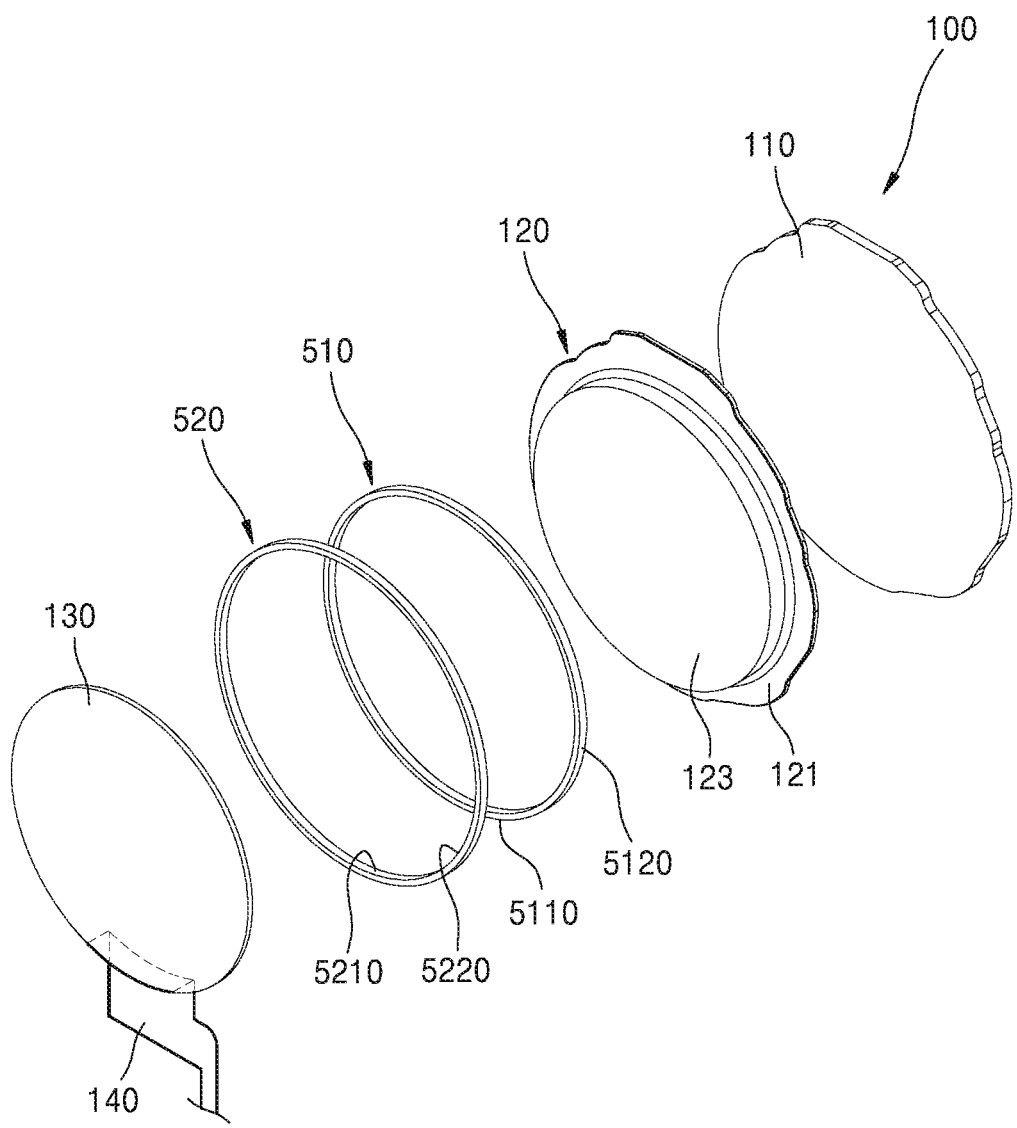

FIG. 3 is an exploded perspective view of the body 10 of the wearable device 1 of FIG. 1. FIGS. 4A and 4B are respectively an assembled perspective view and an exploded perspective view of the display device 100 of FIG. 3.

Referring to FIG. 3, the case 200 includes a front case 210 through which the insertion hole H1 is formed, and a rear case 220 provided at the rear Z2 of the front case 210. Here, the rear Z2 is defined to be an opposite direction of the front Z1.

The bracket 310, the main board 320, and the battery 330 are provided at the rear Z2 of the display device 100. The bracket 310 may be supported by the rear case 220. The main board 320 and the battery 330 may be provided between the bracket 310 and the rear case 220.

The display device 100 may be supported by the bracket 310. However, a supporting method of the display device 100 is not limited thereto, and may vary. For example, the display device 100 may be supported by the rear case 220 or the front case 210, without the bracket 310.

Referring to FIGS. 3, 4A, and 4B, the display device 100 may include a display 110 displaying an image or a video, a glass member 120 provided at the front Z1 of the display 110, and a touch sensor 130 detecting a touch of the user.

The glass member 120 is a transparent member and is provided at the front Z1 of the display 110 to protect the display 110 from an external impact and externally expose an image or a video displayed in the display 110.

When the wearable device 1 is worn on a wrist, an external impact may be frequently applied to the wearable device 1, and strength of the external impact may be high. Accordingly, the glass member 120 may have a thickness to protect the display 110. For example, the thickness of the glass member 120 may be 1 mm to 5 mm. According to the example embodiment, the thickness of the glass member 120 is measured in a front-and-back direction. When the thickness of the glass member 120 is partially different as shown in FIG. 4B, the thickness may be a maximum thickness.

The glass member 120 may have a shape that obtains an intensity while reducing an increase of the thickness or size. For example, the glass member 120 may include a base portion 121 having a size larger than that of the insertion hole H1, and an intensity reinforcing portion 123 protruding to the front Z1 from the base portion 121.

A shape of the intensity reinforcing portion 123 may correspond to a shape of the insertion hole H1. For example, when the shape of the insertion hole H1 is a circle, the shape of the intensity reinforcing portion 123 may also be a circle.

The size of the intensity reinforcing portion 123 may be smaller than that of the base portion 121. The size of the intensity reinforcing portion 123 may be smaller than that of the insertion hole H1, The thickness of the intensity reinforcing portion 123 may be greater than that of the base portion 121.

The touch sensor 130 may detect a touch of the user via an electrostatic method. Also, the touch sensor 130 may function as a fingerprint recognition sensor using an on-screen method that detects a fingerprint of the user.

To detect the touch of the user via the electrostatic method, the touch sensor 130 may be provided at the front Z1 of the glass member 120.

To connect the touch sensor 130 provided at the front Z1 of the glass member 120 to the main board 320 provided at the rear Z2 of the display 110, the touch sensor 130 may be connected to a flexible circuit 140.

An electric signal may be transferred between the touch sensor 130 and the main board 320 through the flexible circuit 140. For example, the flexible circuit 140 may include a circuit wire transmitting an input signal from the main board 320 to the touch sensor 130, and a circuit wire transmitting an output signal from the touch sensor 130 to the main board 320. Such circuit wires or the flexible circuit 140 may be referred to as a circuit trace.

The flexible circuit 140 may have a width and thickness. For example, the width of the flexible circuit 140 may be about 0.05 mm to about 5 mm, and the thickness thereof may be about 10 um to about 200 um.

Although the width and thickness of the flexible circuit 140 are small as such, a gap may exist between the case 200 and the glass member 120 by the existence of the flexible circuit 140. Such a gap may affect waterproof performance of the wearable device 1.

The wearable device 1 according to an example embodiment may further include a waterproof structure preventing water from flowing between the glass member 120 and the case 200. To improve waterproof performance of the waterproof structure, the wearable device 1 includes a first waterproof member 510 and a second waterproof member 520 provided between the glass member 120 and the front case 210. The first and second waterproof members 510 and 520 may be arranged along a direction perpendicular to the front-and-back direction.

The first waterproof member 510 surrounds an edge of the glass member 120. The first waterproof member 510 has a ring structure. For example, the first waterproof member 510 may have a circular ring structure.

The first waterproof member 510 may be elastically deformed. A material of the first waterproof member 510 may include any one or any combination of polymer, rubber, and plastic, which have elasticity.

An inner diameter of the first waterproof member 510 in a state in which no external force is applied thereto is less than an outer diameter of the intensity reinforcing portion 123 of the glass member 120. Accordingly, the first waterproof member 510 may contact the glass member 120 without a gap between the glass member 120 and the first waterproof member 510 when the first waterproof member 510 is assembled to the glass member 120.

The second waterproof member 520 surrounds an edge of the first waterproof member 510. The second waterproof member 520 has a ring structure. For example, the second waterproof member 520 may have a circular ring structure.

The second waterproof member 520 may be elastically deformed. A material of the second waterproof member 520 may include any one or any combination of polymer, rubber, and plastic having elasticity. The material of the second waterproof member 520 may be the same as that of the first waterproof member 510.

An inner diameter of the second waterproof member 520 in a state in which no external force is applied thereto is less than an outer diameter of the first waterproof member 510 assembled to the glass member 120. Accordingly, the second waterproof member 520 may contact the first waterproof member 510 without a gap between the first waterproof member 510 and the second waterproof member 520 when the second waterproof member 520 is assembled to the first waterproof member 510.

The flexible circuit 140 may be provided at a partial region between the first and second waterproof members 510 and 520. An inner surface of the flexible circuit 140 contacts an outer surface of the first waterproof member 510, and an outer surface of the flexible circuit 140 contacts an inner surface of the second waterproof member 520.

The outer surface of the first waterproof member 510 includes a first contact region 5110 contacting the flexible circuit 140, and a second contact region 5120 contacting the inner surface of the second waterproof member 520.

The inner surface of the second waterproof member 520 includes a third contact region 5210 contacting the flexible circuit 140, and a fourth contact region 5220 contacting the outer surface of the first waterproof member 510.

Figure 5:
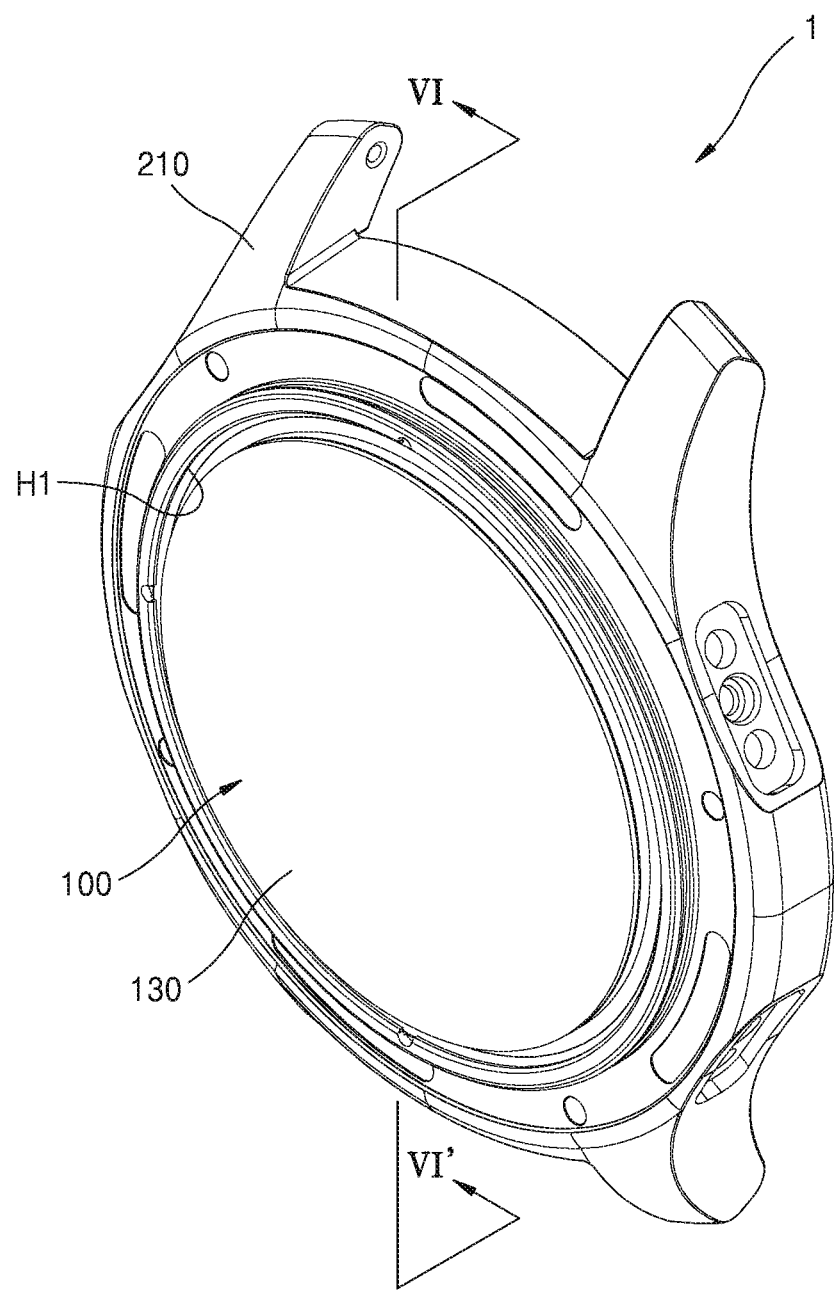
FIG. 5 is an assembled perspective view of the wearable device of FIG. 3.
Figure 6:
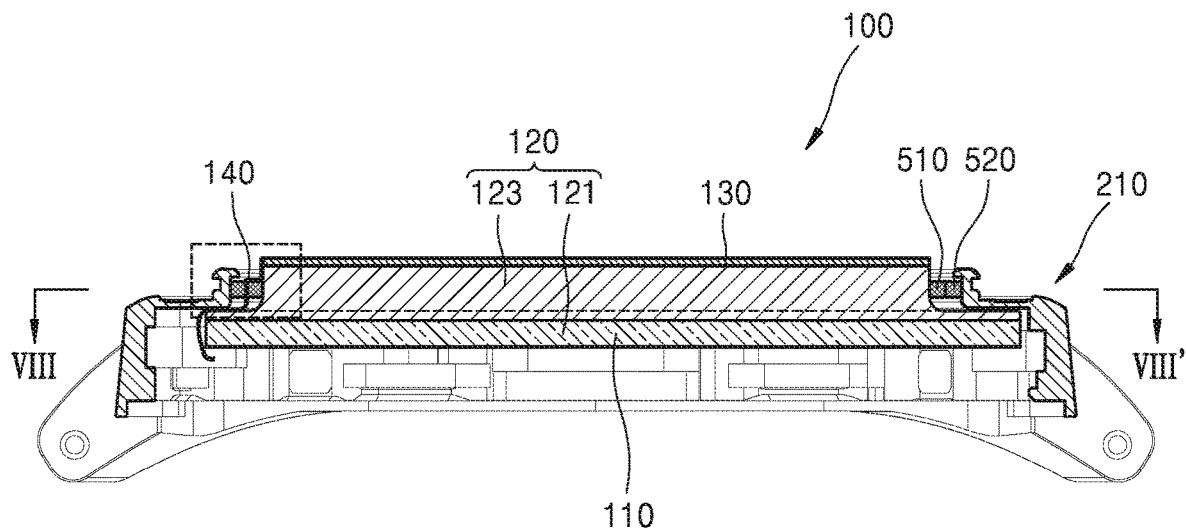
FIG. 6 is a cross-sectional view taken along a line VI-VI' of FIG. 5.
Figure 7:
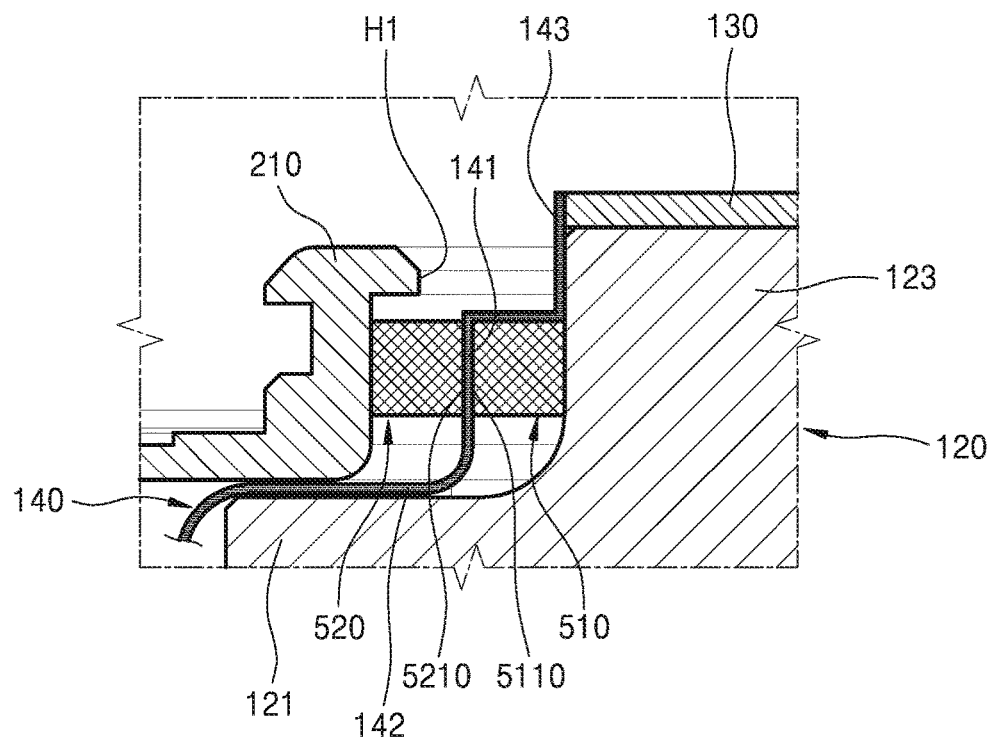
FIG. 7 is an enlarged view of a partial region of FIG. 6.
Figure 8:
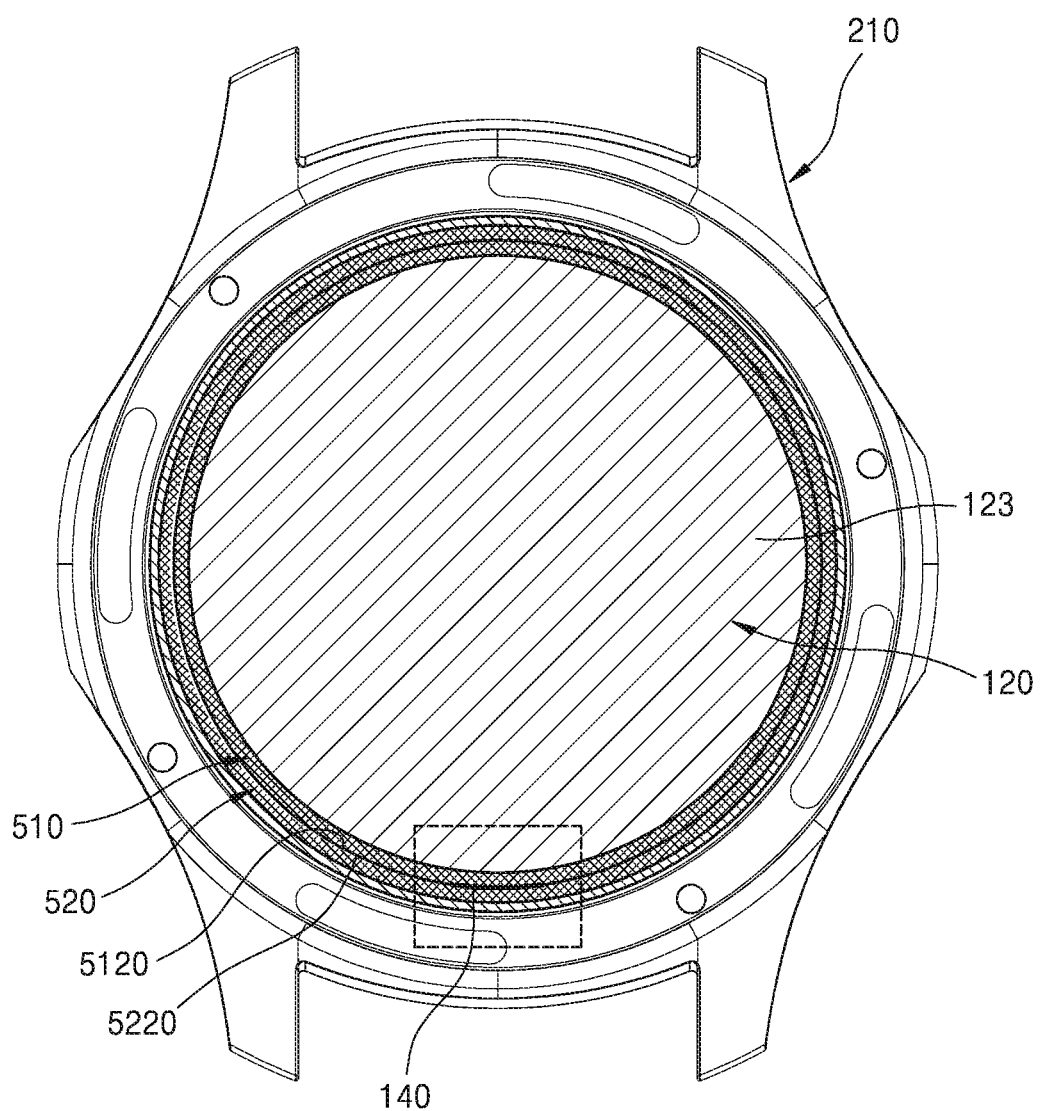
FIG. 8 is a cross-sectional view taken along a line VIII-VIII' of FIG. 6.
Figure 9:
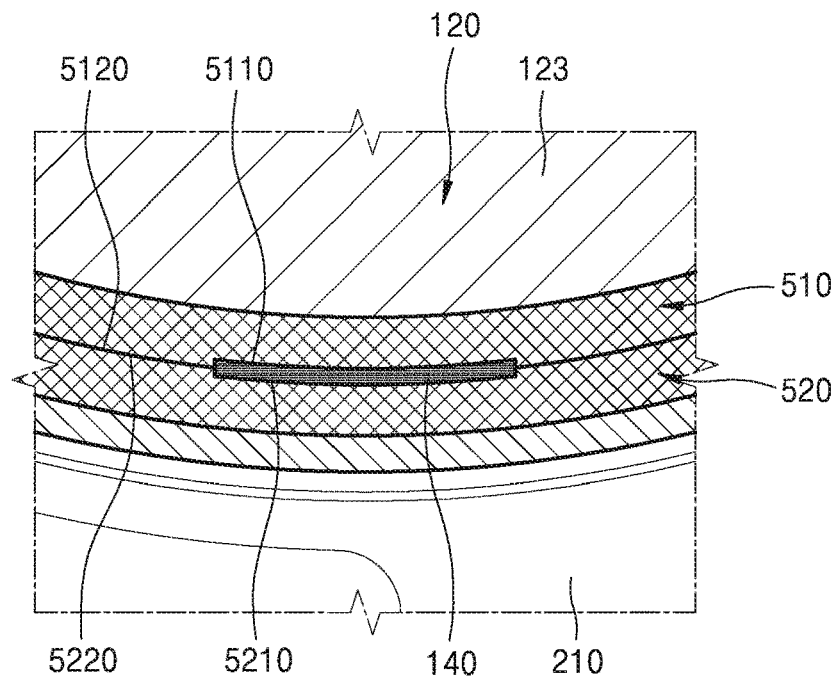
FIG. 9 is an enlarged view of a partial region of FIG. 8.

FIG. 5 is an assembled perspective view of the wearable device 1 of FIG. 3, FIG. 6 is a cross-sectional view taken along a line VI-VI' of FIG. 5, and FIG. 7 is an enlarged view of a partial region of FIG. 6. Also, FIG. 8 is a cross-sectional view taken along a line VIII-VIII' of FIG. 6, and FIG. 9 is an enlarged view of a partial region of FIG. 8.

Referring to FIGS. 5 through 9, the first waterproof member 510 surrounds the edge of the intensity reinforcing portion 123, the first contact region 5110 contacts the inner surface of the flexible circuit 140, and the second contact region 5120 contacts the fourth contact region 5220 of the second waterproof member 520. The second waterproof member 520 surrounds the edge of the first waterproof member 510, and the third contact region 5210 contacts the outer surface of the flexible circuit 140. The front case 210 surrounds the edge of the second waterproof member 520.

The flexible circuit 140 includes a connecting portion 143 connected to the touch sensor 130, a first portion 141 provided between the first and second waterproof members 510 and 520, and a second portion 142 extending from the first portion 141 and provided between the front of the base portion 121 and the rear of the second waterproof member 520.

A sum of the thickness of the first waterproof member 510 in a natural state and the thickness of the second waterproof member 520 in a natural state may be greater than an interval between the intensity reinforcing portion 123 and the front case 210. Because the intensity reinforcing portion 123 and the front case 210 have fixed locations and are not elastically deformed, the interval between the intensity reinforcing portion 123 and the front case 210 is not changed. Accordingly, while the first and second waterproof members 510 and 520 are provided between the intensity reinforcing portion 123 and the front case 210, the first and second waterproof members 510 and 520 are pressurized and elastically deformed by the intensity reinforcing portion 123 and the front case 210. Accordingly, the thicknesses of the first and second waterproof members 510 and 520 are respectively smaller than those of the first and second waterproof members 510 and 520 in the natural state. At this time, the first and second waterproof members 510 and 520 are pressurized in a direction approaching the flexible circuit 140, and accordingly, may be deformed to shapes corresponding to the shape of the flexible circuit 140. The first and second waterproof members 510 and 520 may contact the flexible circuit 140 without any gap or with a minimum gap being formed between each of the first and second waterproof members 510 and 520 and the flexible circuit 140. Accordingly, water may be prevented from penetrating between the glass member 120 and the front case 210 as no gap is generated due to the existence of the flexible circuit 140 when the touch sensor 130 is arranged in the front of the glass member 120.

When only one waterproof member is used, the waterproof member is unable to be adhered to both the inner surface and the outer surface of the flexible circuit 140, and thus waterproof performance may deteriorate. Also, when a waterproof tape is used, durability of the wearable device 1 is not secured if water pressure is high.

However, in the wearable device 1 according to an example embodiment, even though the flexible circuit 140 is provided between the glass member 120 and the case 200, the first and second waterproof members 510 and 520 are adhered to the flexible circuit 140, and thus waterproof performance may be remarkably improved. For example, the wearable device 1 according to an example embodiment may have a waterproof function and may sustain water pressure of up to 5 atmospheres.

FIGS. 10A, 10B, 10C and 10D are cross-sectional views of first waterproof members 510A through 510D and second waterproof members 520A through 520D, according to other example embodiments. FIGS. 11A and 11B are plan views of first waterproof members 510 and 510E and second waterproof members 520 and 520E, according to other example embodiments.

Referring to FIGS. 10A through 10D, outer surfaces of the first waterproof members 510A through 510D, and inner surfaces of the second waterproof members 520A through 520D may have corresponding shapes in a front-and-back direction.

Figure 10A:
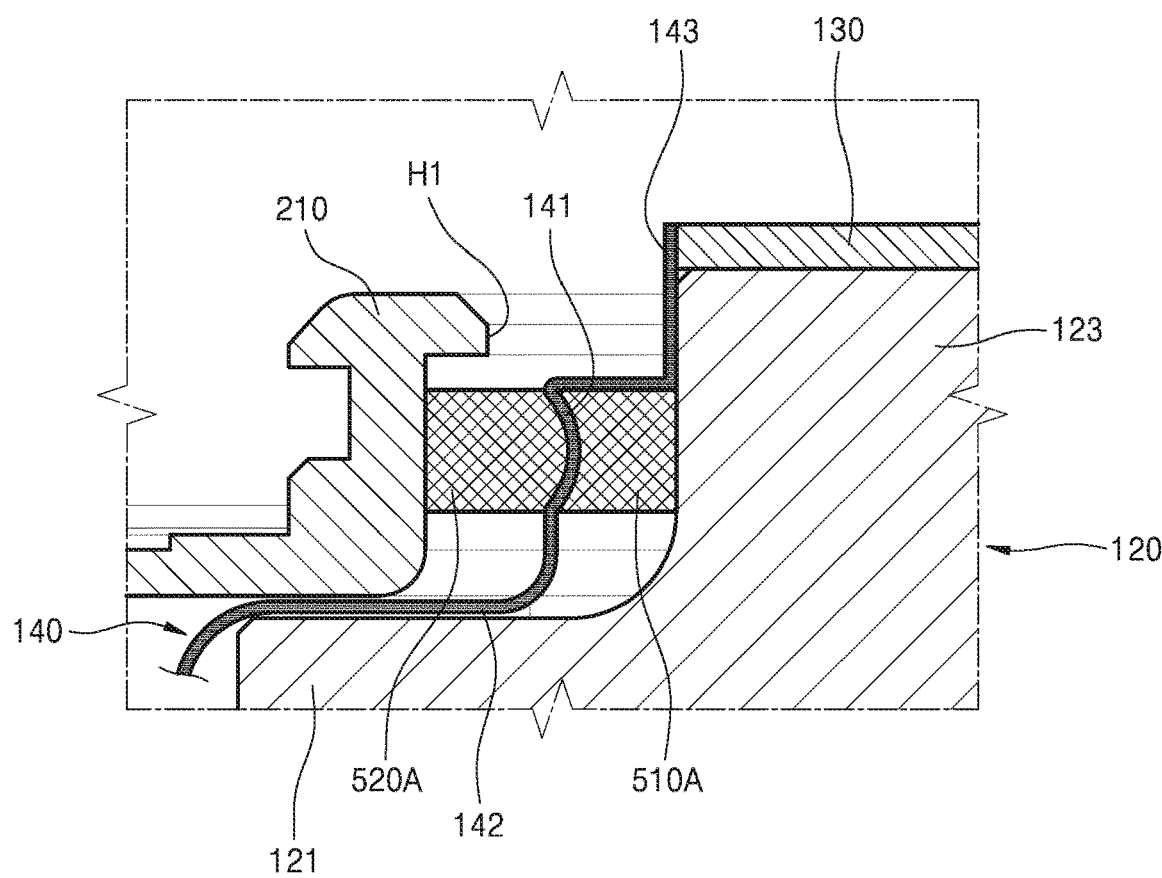
FIGS. 10A, 10B, 10C and 10D are cross-sectional views of first waterproof members and second waterproof member, according to other example embodiments.
Figure 10B:
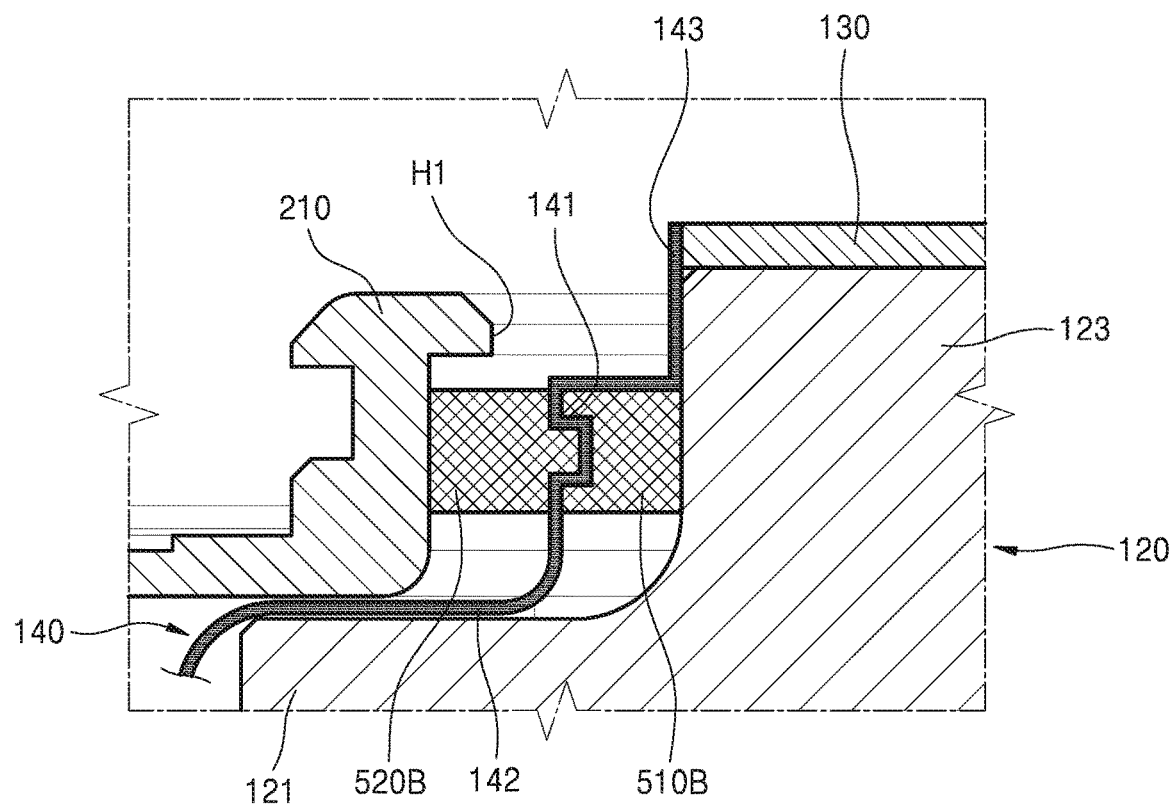
Figure 10C:
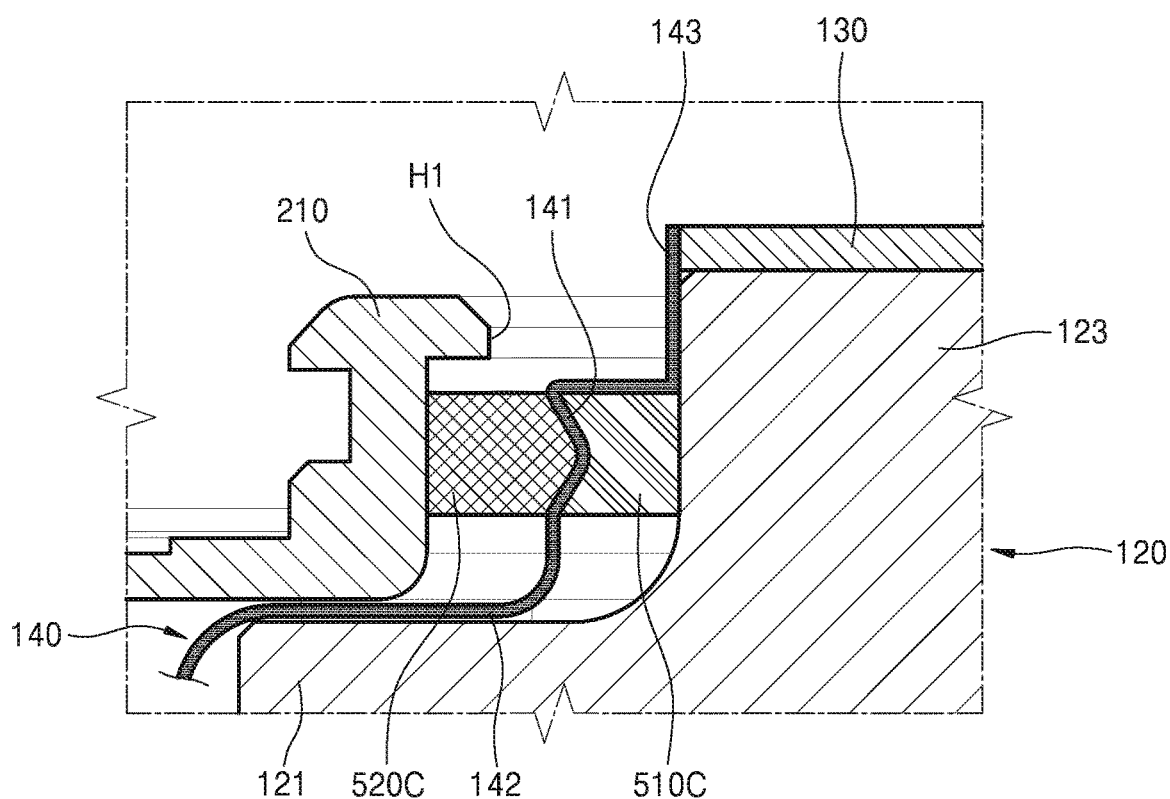

For example, as shown in FIGS. 10A through 10C, the outer surfaces of the first waterproof members 510A through 510C may have concave shapes, and the inner surfaces of the second waterproof members 520A through 520C may have convex shapes. As another example, as shown in FIG. 10D, the outer surface of the first waterproof member 510D may have a convex shape, and the inner surface of the second waterproof member 520D may have a concave shape.

Figure 10D:
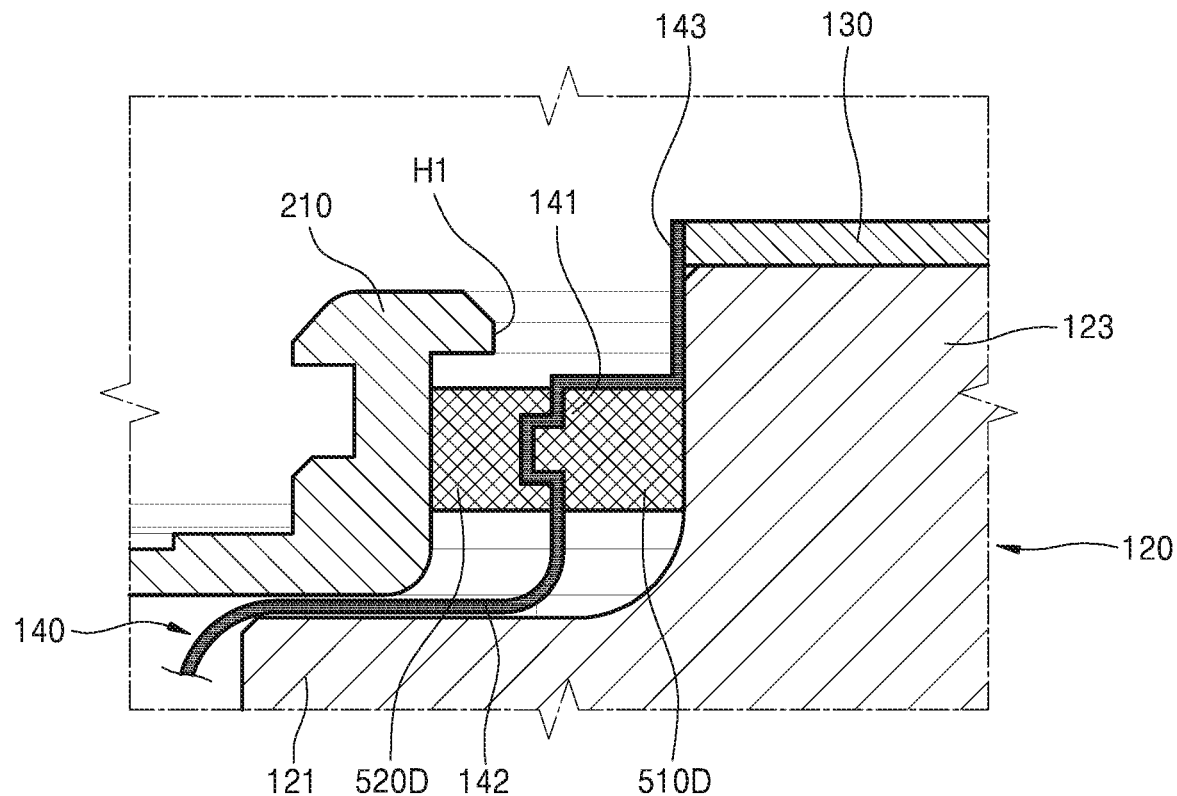
Figure 11A:
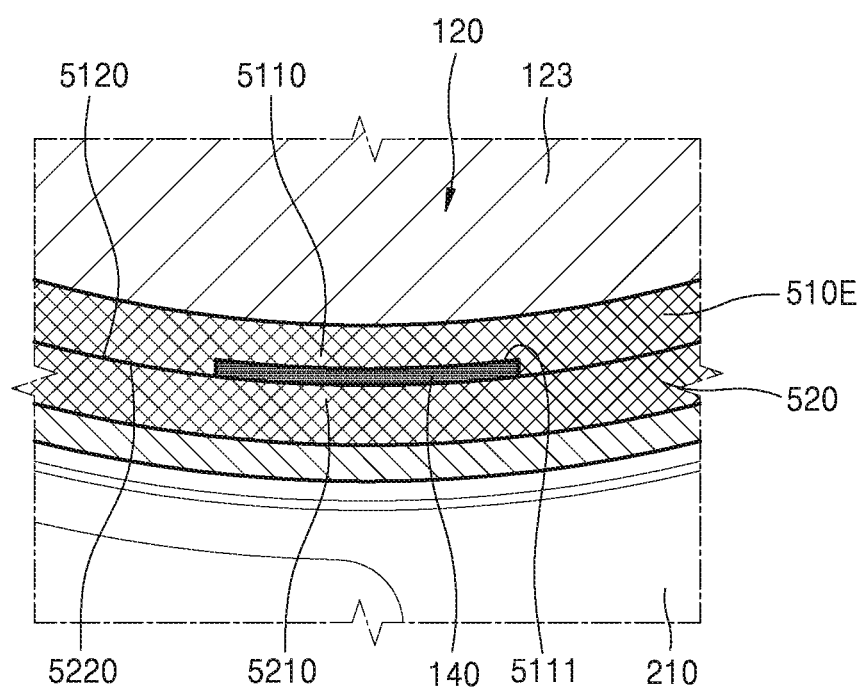
FIGS. 11A and 11B are plan views of first waterproof members and second waterproof members, according to other example embodiments.
Figure 11B:
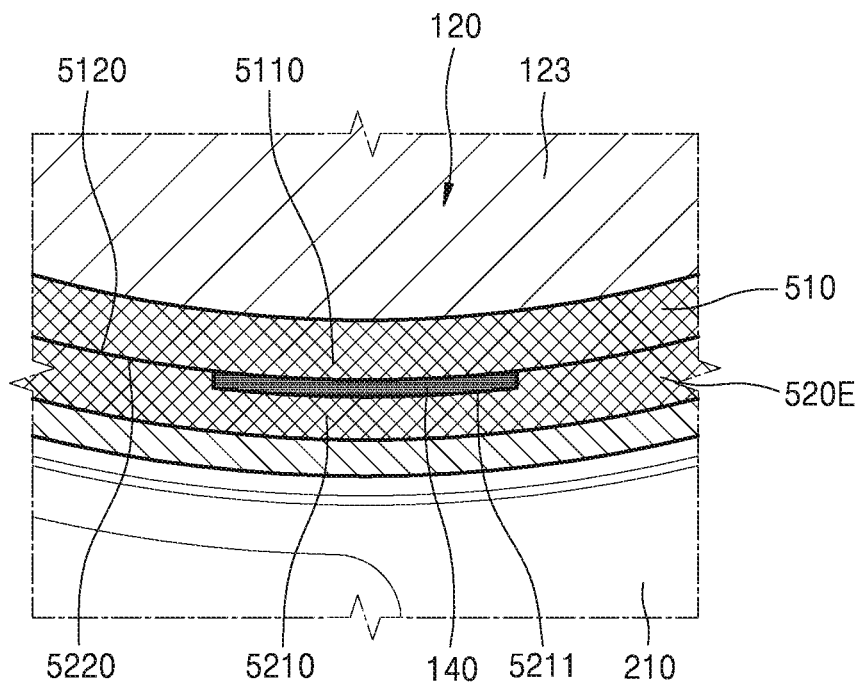

As shown in FIGS. 10A, 10B, and 10D, the first waterproof members 510A through 510D may be manufactured separately from and assembled to the glass member 120.

However, an arranging process of the first waterproof member 510C is not limited thereto, and may be directly molded to the glass member 120 as shown in FIG. 10C. At this time, a material of the first waterproof member 510C may be different from that of the second waterproof member 520C. For example, the material of the first waterproof member 510C may be more flexible than the material of the second waterproof member 520C. The material of the first waterproof member 510C may be silicon rubber.

Referring to FIGS. 11A and 11B, several outer surfaces of the first waterproof members 510 and 510E and inner surfaces of the second waterproof members 520 and 520E may include grooves 5111 and 5211 corresponding to the width and thickness of the flexible circuit 140. The grooves 5111 and 5211 may be formed in a direction perpendicular to the front-and-back direction.

For example, as shown in FIG. 11A, the groove 5111 corresponding to the width and thickness of the flexible circuit 140 may be formed on the first contact region 5110 of the first waterproof member 510E. As another example, as shown in FIG. 11B, the groove 5211 corresponding to the width and thickness of the flexible circuit 140 may be formed on the third contact region 5210 of the second waterproof member 520E. Accordingly, generation of minute gaps between the first waterproof members 510 and 510E, the second waterproof members 520 and 520E, and the flexible circuit 140 may be prevented.

Figure 12:
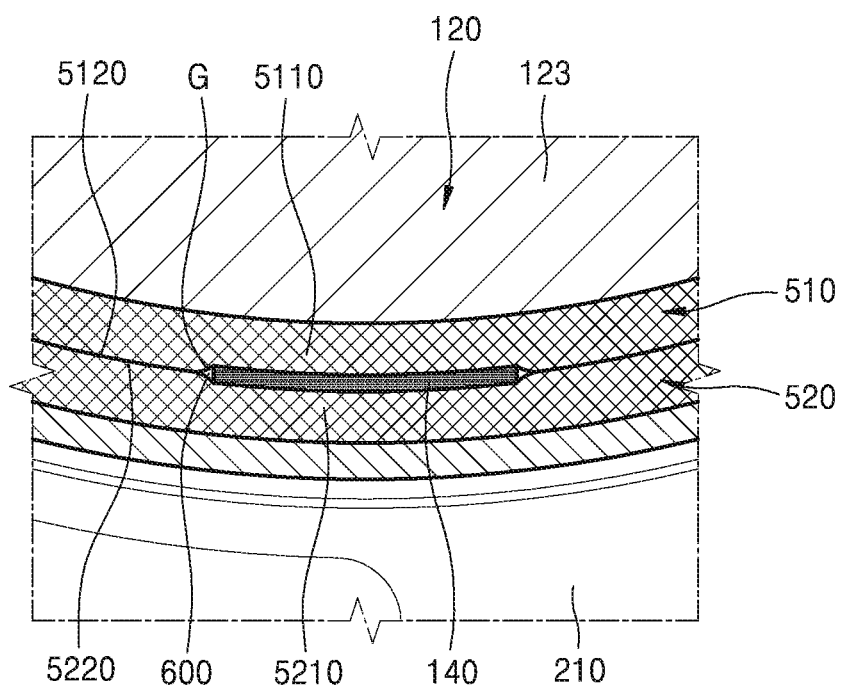
FIG. 12 is a plan view for describing a waterproof structure according to another example embodiment.

FIG. 12 is a plan view for describing a waterproof structure according to another example embodiment.

As another example, referring to FIG. 12, a waterproof adhesive 600 may be injected into a minute gap G defined by the first waterproof member 510, the second waterproof member 520, and the flexible circuit 140. Accordingly, even when the minute gap G is generated, the minute gap G is blocked by the waterproof adhesive 600, and thus waterproof performance may be increased.

Figure 13:
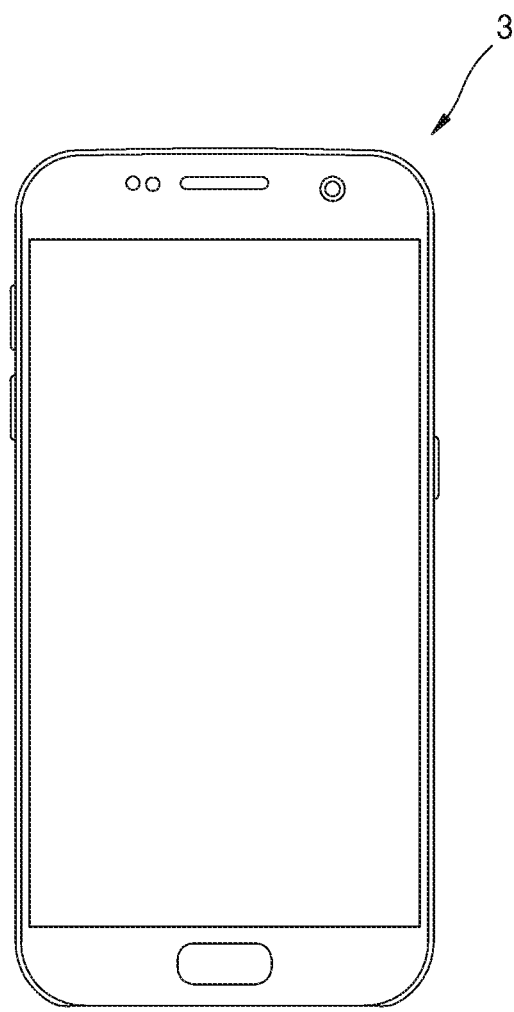
FIG. 13 is an assembled perspective view of an electronic device according to an example embodiment.

The wearable devices 1 and 2 are mainly described as an example of an electronic device, but the electronic device is not limited thereto and may vary. For example, an electronic device according to an example embodiment may alternatively be a smart phone 3 as shown in FIG. 13, or a tablet PC.

A wearable device and an electronic device according to the example embodiments may provide improved waterproof function.

As is traditional in the field of the inventive concepts, example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

It may be understood that the example embodiments described herein may be considered in a descriptive sense only and not for purposes of limitation. Descriptions of features or aspects within each example embodiment may be considered as available for other similar features or aspects in other example embodiments.

While the example embodiments have been described with reference to the figures, it will be understood by those of ordinary skill in the art that various changes in form and details may be made therein without departing from the spirit and scope as defined by the following claims.

What is claimed is:

1. A wearable device comprising:
a display;
a glass member disposed on a first surface of the display, and comprising:
a base portion having a first size larger than a second size of an insertion hole; and
an intensity reinforcing portion having a third size smaller than the first size of the base portion and protruding forward from the base portion;
a touch sensor disposed on the glass member;
a main board disposed on a second surface of the display;
a flexible circuit configured to transmit an electric signal between the touch sensor and the main board;
a first waterproof member having a first inner edge surrounding and contacting a first outer edge of the glass member, the first waterproof member being elastically deformable, and a top of the first waterproof member being lower than a top surface of the intensity reinforcing portion of the glass member;
a second waterproof member having a second inner edge surrounding and contacting a second outer edge of the first waterproof member, the second waterproof member being elastically deformable, and a top of the second waterproof member being lower than the glass member,
wherein a first portion of the flexible circuit is connected to the touch sensor and disposed on a first front surface of the first waterproof member, and a second portion of the flexible circuit is interposed between the second outer edge of the first waterproof member and the second inner edge of the second waterproof member;
a case comprising the insertion hole into which the touch sensor is inserted, the case surrounding and contacting a third outer edge of the second waterproof member, the case accommodating the main board, the display, and the glass member that are disposed in the case, and a third portion of the flexible circuit being interposed between the case and the base portion; and
a strap connected to the case and configured to be wearable by a user.

2. The wearable device of claim 1, wherein the first waterproof member surrounds and contacts a fourth outer edge of the intensity reinforcing portion, and
the flexible circuit further comprises a fourth portion extending from the second portion and interposed between a second front surface of the base portion and a rear surface of the second waterproof member.

3. The wearable device of claim 1, wherein the second outer edge of the first waterproof member and the second inner edge of the second waterproof member have corresponding shapes.

4. The wearable device of claim 3, wherein one of the second outer edge of the first waterproof member and the second inner edge of the second waterproof member has a concave shape, and
another one of the second outer edge of the first waterproof member and the second inner edge of the second waterproof member has a convex shape that corresponds to the concave shape.

5. The wearable device of claim 1, wherein the second outer edge of the first waterproof member or the second inner edge of the second waterproof member comprises a groove corresponding to a width and a thickness of the flexible circuit.

6. The wearable device of claim 1, further comprising a waterproof adhesive disposed in a space defined by the flexible circuit, the first waterproof member, and the second waterproof member.

7. The wearable device of claim 1, wherein a thickness of the glass member is from about 1 mm to about 5 mm.

8. The wearable device of claim 1, wherein the case comprises:
a front case comprising the insertion hole and surrounding and contacting the third outer edge of the second waterproof member; and
a rear case disposed at a rear of the front case.

9. The wearable device of claim 8, wherein the first waterproof member and the second waterproof member are pressurized by the front case and the glass member.

10. The wearable device of claim 1, wherein the first waterproof member has, from a plane view, the first inner edge surrounding and contacting the first outer edge of the glass member, and
the second waterproof member has, from the plane view, the second inner edge surrounding and contacting the second outer edge of the first waterproof member.

11. The wearable device of claim 1, wherein each of the first waterproof member and the second waterproof member has a ring structure.

12. The wearable device of claim 11, wherein a first diameter of the first waterproof member is less than a second diameter of the second waterproof member.

13. The wearable device of claim 12, wherein the first diameter of the first waterproof member is greater than a third diameter of the glass member.

* * * * *